US011476864B2

(12) United States Patent
Zhang et al.

(10) Patent No.: US 11,476,864 B2
(45) Date of Patent: Oct. 18, 2022

(54) CONTROL CIRCUIT OF PIPELINE ADC

(71) Applicant: REALTEK SEMICONDUCTOR CORPORATION, Hsinchu (TW)

(72) Inventors: Pan Zhang, Suzhou (CN); Kai-Yin Liu, Hsinchu (TW); Shih-Hsiung Huang, Hsinchu (TW); Wei-Jyun Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/410,382

(22) Filed: Aug. 24, 2021

(65) Prior Publication Data

US 2022/0158649 A1    May 19, 2022

(30) Foreign Application Priority Data

Nov. 19, 2020   (TW) .................................. 109140482

(51) Int. Cl.
| | | |
|---|---|---|
| *H03M 1/38* | (2006.01) | |
| *H03M 1/16* | (2006.01) | |
| *H03M 1/46* | (2006.01) | |
| *H03M 1/10* | (2006.01) | |
| *H03M 1/80* | (2006.01) | |
| *H03M 1/12* | (2006.01) | |
| *H03M 1/44* | (2006.01) | |

(52) U.S. Cl.
CPC ......... *H03M 1/164* (2013.01); *H03M 1/1014* (2013.01); *H03M 1/1245* (2013.01); *H03M 1/44* (2013.01); *H03M 1/466* (2013.01); *H03M 1/806* (2013.01)

(58) Field of Classification Search
CPC .... H03M 1/1464; H03M 1/44; H03M 1/1245; H03M 1/1014
USPC ................................ 341/161, 155, 144, 122
See application file for complete search history.

(56) References Cited

U.S. PATENT DOCUMENTS 11,211,904 B1 * 12/2021 Gupta ................. H03F 3/45475

OTHER PUBLICATIONS

Chen "The Design and Analysis of a CMOS 8bit 40MS/s Pipelined Analog-to-Digital Converter", May 2004, National Chiao Tung University, Hsin-Chu, Taiwan.
(Continued)

*Primary Examiner* — Peguy Jean Pierre
(74) *Attorney, Agent, or Firm* — WPAT, PC

(57) ABSTRACT

A control circuit of a pipeline analog-to-digital converter (ADC) is provided. The pipeline ADC includes a multiplying digital-to-analog converter (MDAC) which includes a capacitor. The control circuit includes six switches and two buffer circuits. The first and second switches are respectively coupled between one end of the capacitor and the first and second reference voltages. The output terminals of the first and second buffer circuits are respectively coupled to the first and second switches. The input terminal of the first buffer circuit is coupled to the third reference voltage through the third switch, or receives a control signal through the fifth switch. The input terminal of the second buffer circuit is coupled to the fourth reference voltage through the fourth switch, or receives the control signal through the sixth switch. The first and second reference voltages are different, and the first and second switches are not turned on simultaneously.

15 Claims, 12 Drawing Sheets

(56) References Cited

OTHER PUBLICATIONS

Ho "A Digitally Background Calibrated Pipelined ADC Using Open-Loop Residue Amplifiers", Sep. 2010, National Chiao Tung University, Hsin-Chu, Taiwan.

Qazi Omar Farooq, "Modeling and Implementation of a 6-Bit, 50MHz Pipelined ADC in CMOS" Department of Electrical and Information Technology Faculty of Engineering, LTD, Lund University, Lund, Sweden.

Hong et al. "A 7b 1GS/s 7.2mW Nonbinary 2b/cycle SAR ADC with Register-to-DAC Direct Control", Sep. 2012 IEEE, San Jose, CA, USA.

* cited by examiner

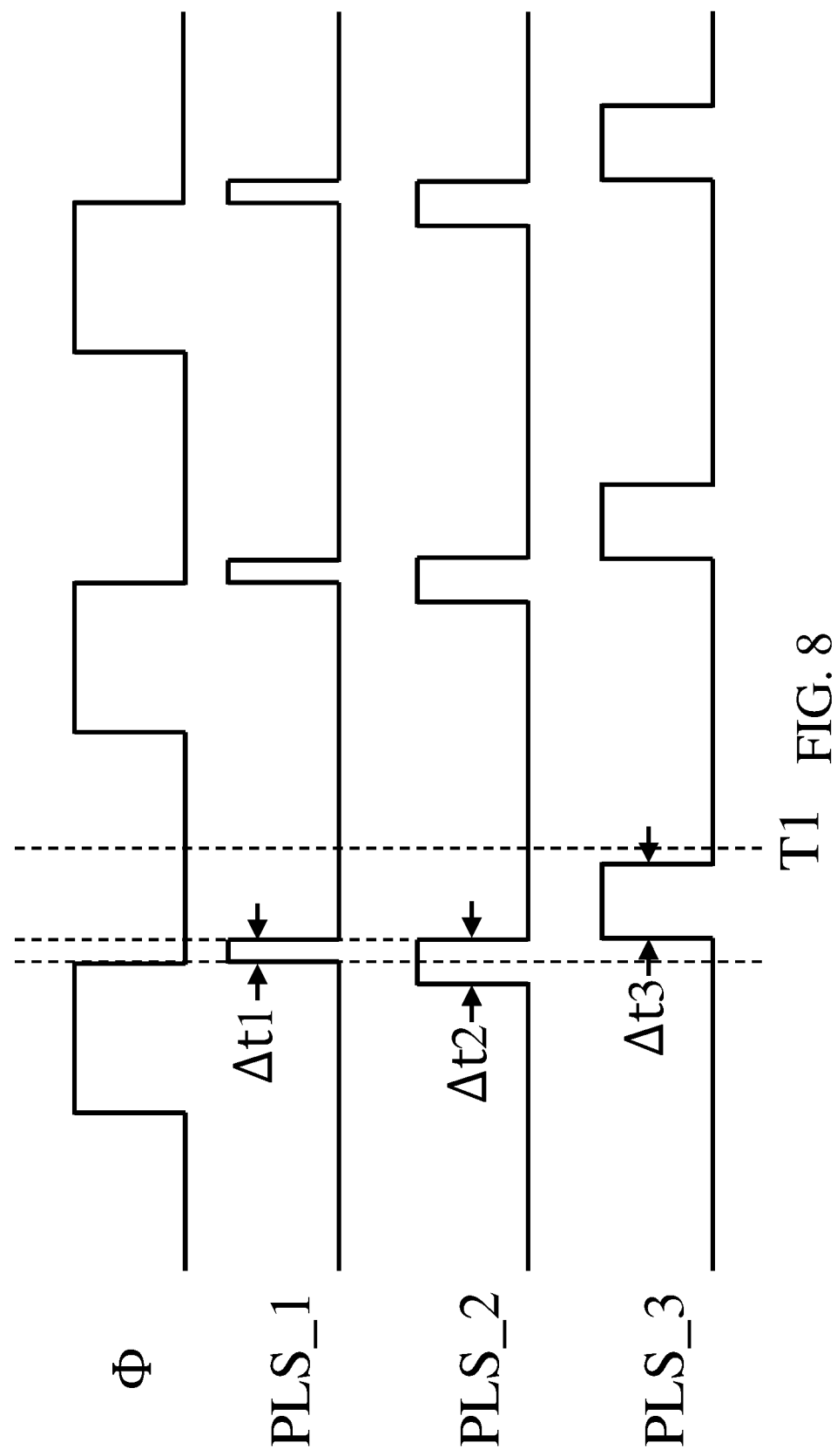

CONTROL CIRCUIT OF PIPELINE ADC

BACKGROUND OF THE INVENTION

1. Field of the Invention

This disclosure generally relates to analog-to-digital converters (ADCs), and, more particularly, to the control circuit of a pipeline ADC (also referred to as pipelined ADC).

2. Description of Related Art

FIG. 1 is a conventional pipeline ADC 100, which includes multiple serially connected operational stages 110, a terminal ADC 120, and a digital correction circuit 130. After the differential input signal $V_{in}$ is processed by multiple operational stages in which comparison, subtraction, and amplification operations are performed, the digital correction circuit 130 finally corrects the output of each operational stage 110 and the output of the terminal ADC 120 to generate a digital code D, which is the result of the analog-to-digital conversion of the differential input signal $V_{in}$. The operation principles of the pipeline ADC 100 are well known to those of ordinary skill in the art, and the details are thus omitted for brevity.

FIG. 2 shows a functional block diagram of any operational stage 110 in FIG. 1. The operational stage 110 includes a sub-ADC 112, a latch circuit 114 (also referred to as a storage circuit), an encoder 116, and a multiplying digital-to-analog converter (MDAC) 118. The sub-ADC 112 includes multiple comparators (or quantizers) that compare the differential input signal $V_{in}$ with multiple preset voltages ($V_{R1}$ to $V_{Rn}$). The number of comparators (or quantizers) and the number of preset voltages (i.e., the value of n) are associated with the number of bits of the pipeline ADC 100.

The latch circuit 114, which is coupled to the output terminal of the sub-ADC 112, is used to temporarily store the output value of the sub-ADC 112 (i.e., the result of the comparator (or quantizer)) because the result of the comparator (or quantizer) does not last for a long time.

The encoder 116 is used to encode the result of the comparator (or quantizer) and generate a digital signal b. In the amplification phase, the MDAC 118 selects the reference voltage $V_{REF+}$, the reference voltage $V_{REF-}$, and/or the voltage $V_{CM\_REF}$ based on the digital signal b, and the voltage $V_{CM\_REF}$ is the common mode voltage of the reference voltage $V_{REF+}$ and the reference voltage $V_{REF-}$. The MDAC 118 samples the differential input signal $V_{in}$ in the sampling phase and performs subtraction and multiplication operations on the differential input signal $V_{in}$ in the amplification phase to output a differential output signal $V_{out}$. The differential output signal $V_{out}$ becomes the differential input signal of the next operational stage 110 or the terminal ADC 120. In some cases, the MDAC 118 needs only the reference voltage $V_{REF+}$ and the reference voltage $V_{REF-}$, but the voltage $V_{CM\_REF}$ is not required.

However, because there exists at least the latch circuit 114 between the MDAC 118 and the sub-ADC 112 (note that the encoder 116 can be omitted in some implementations), the output value of the sub-ADC 112 is subject to some gate delays before being received by the MDAC 118. These gate delays make it impossible for the MDAC 118 to use the amplification phase completely, resulting in an increase in the power consumption area of the operational amplifier of the MDAC 118.

SUMMARY OF THE INVENTION

In view of the issues of the prior art, an object of this disclosure is to provide a control circuit of a pipeline ADC, so as to make an improvement to the prior art.

According to one aspect of this disclosure, a control circuit of a pipeline analog-to-digital converter (ADC) is provided. The pipeline ADC includes a multiplying digital-to-analog converter (MDAC) which includes a capacitor. The control circuit includes a first switch, a second switch, a third switch, a fourth switch, a fifth switch, a sixth switch, a first buffer circuit, and a second buffer circuit. The first switch is coupled between a first end of the capacitor and a first reference voltage. The second switch is coupled between the first end of the capacitor and a second reference voltage. The first buffer circuit has a first input terminal and a first output terminal. The first output terminal is coupled to the first switch, and the first input terminal is coupled to a third reference voltage through the third switch or receives a control signal through the fifth switch. The second buffer circuit has a second input terminal and a second output terminal. The second output terminal is coupled to the second switch, and the second input terminal is coupled to a fourth reference voltage through the fourth switch or receives the control signal through the sixth switch. The first reference voltage is different from the second reference voltage, and the first switch and the second switch are not turned on simultaneously.

These and other objectives of this disclosure no doubt become obvious to those of ordinary skill in the art after reading the following detailed description of the preferred embodiments with reference to the various figures and drawings.

BRIEF DESCRIPTION OF THE DRAWINGS

FIG. 8 illustrates the clock $\Phi$ and three embodiments of the pulse PLS.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a control circuit of a pipeline ADC. On account of that some or all elements of the control circuit of a pipeline ADC could be known, the detail of such elements is omitted provided that such detail has little to do with the features of this disclosure, and that this omission nowhere dissatisfies the specification and enablement requirements. A person having ordinary skill in the art can choose components equivalent to those described in this specification to carry out this disclosure, which means that the scope of this disclosure is not limited to the embodiments in the specification.

Figure 1:
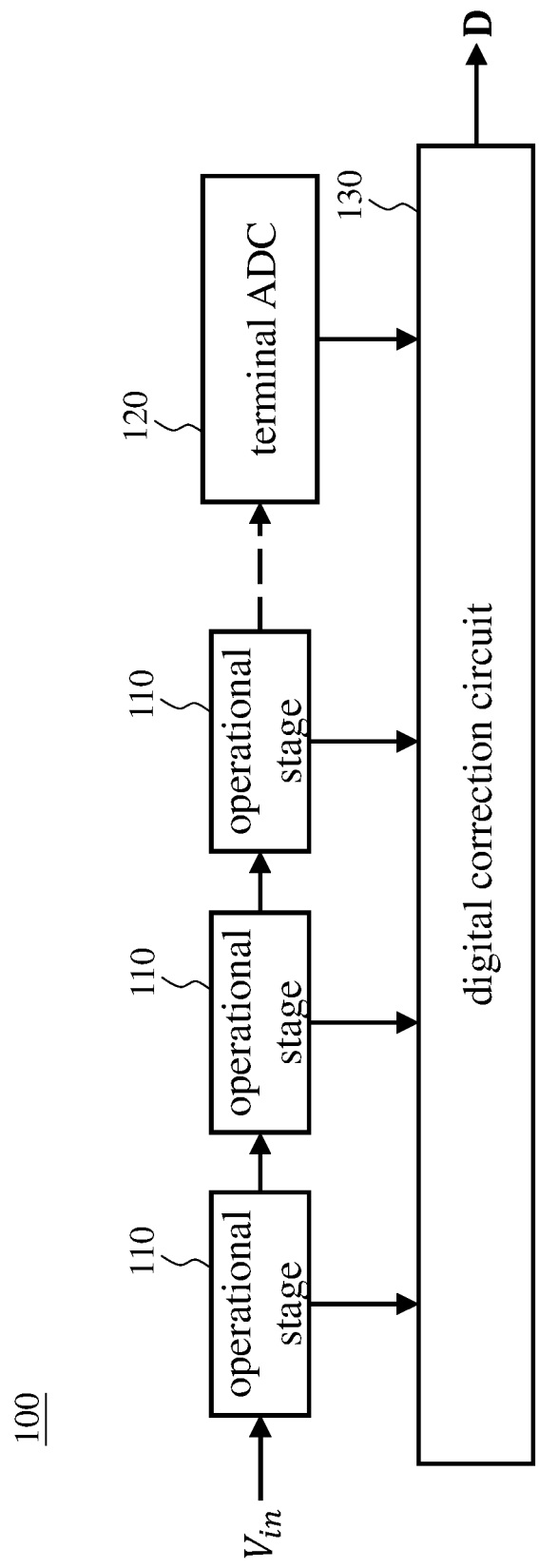
FIG. 1 illustrates a conventional pipeline ADC.
Figure 2:
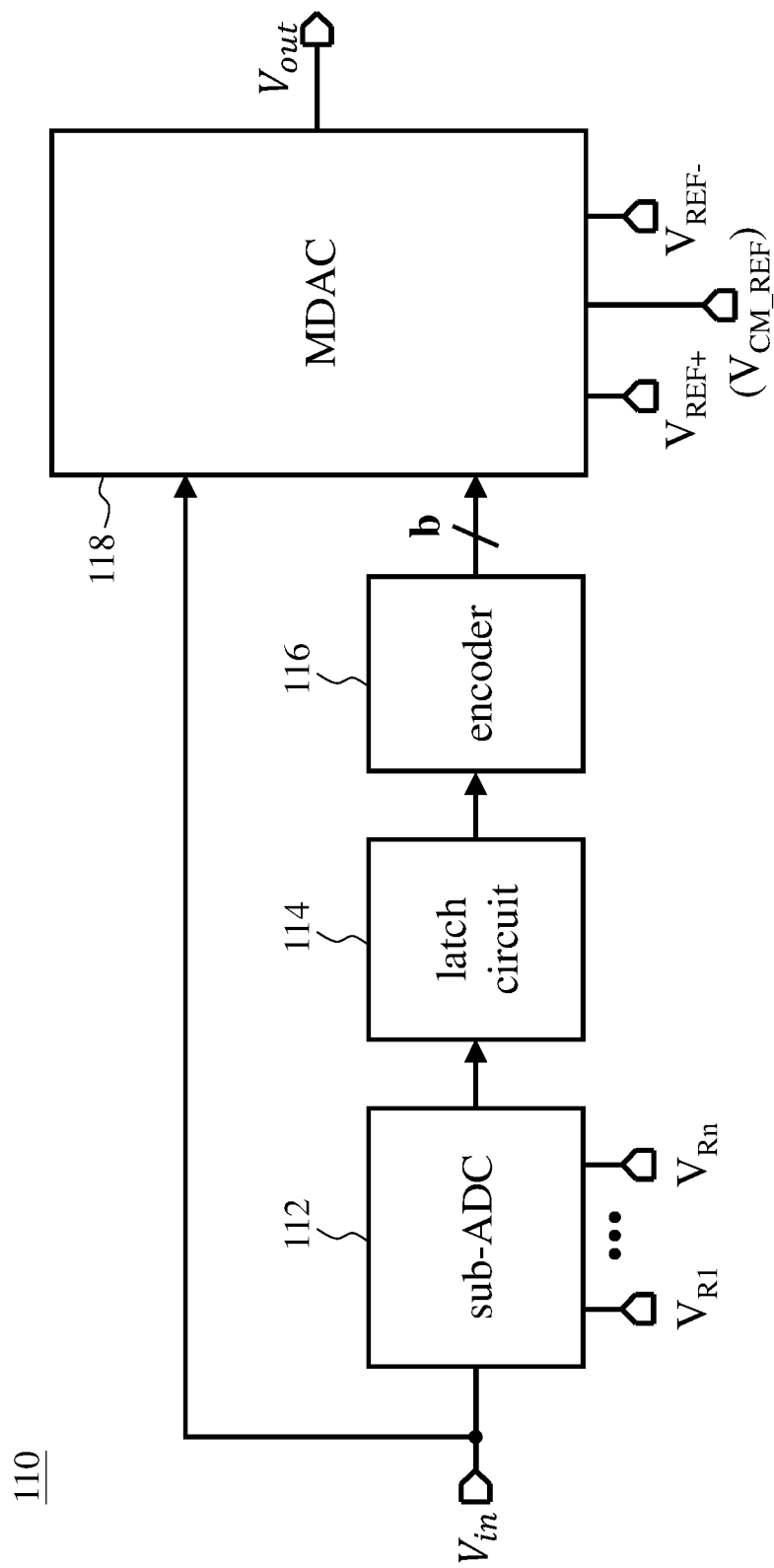
FIG. 2 illustrates a functional block diagram of any operational stage 110 in FIG. 1.
Figure 3:
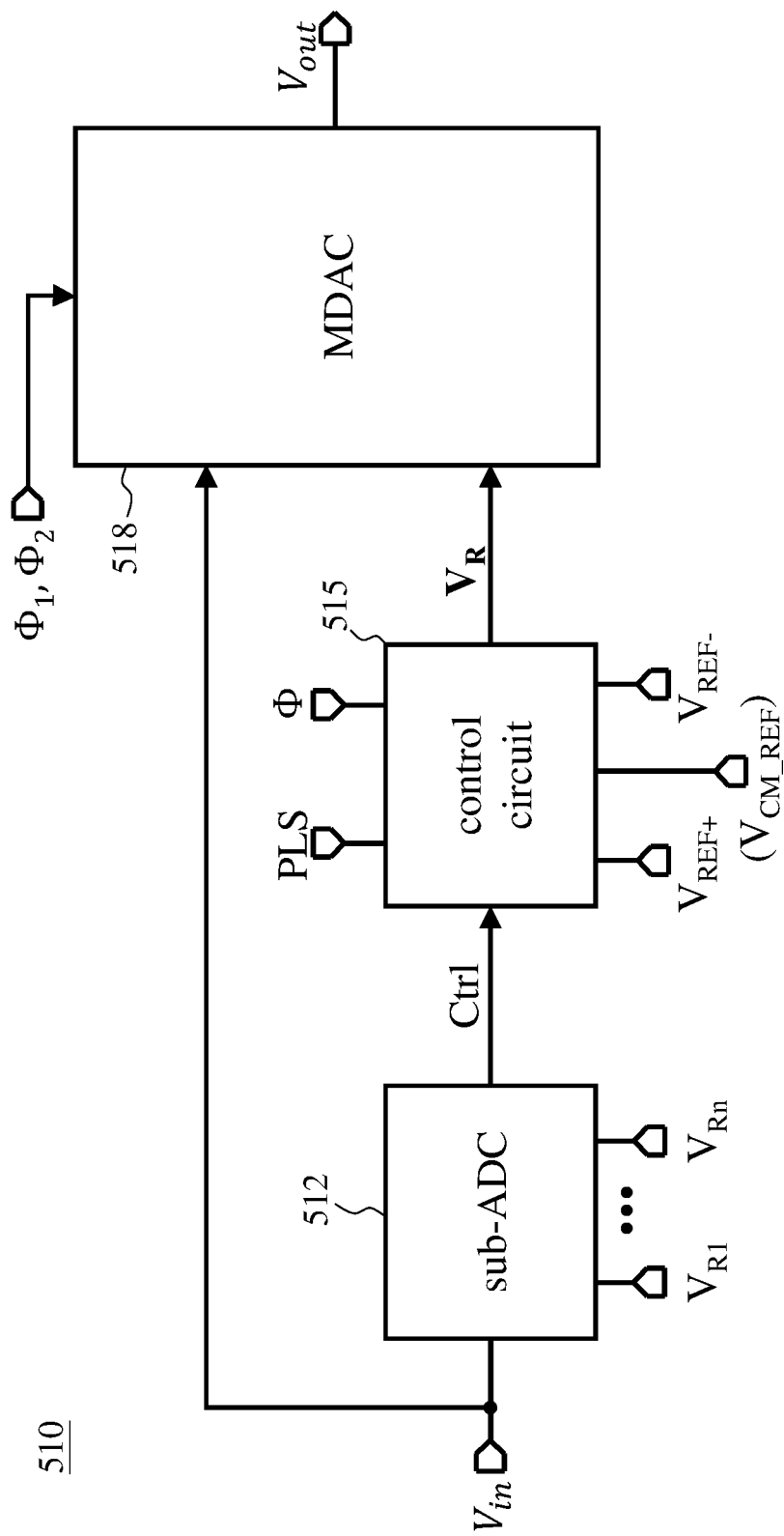
FIG. 3 illustrates a functional block diagram of any operational stage in the pipeline ADC according to an embodiment of this disclosure.

FIG. 3 shows an embodiment of any operational stage in the pipeline ADC of this disclosure. The operational stage 510 includes a sub-ADC 512, a control circuit 515, and an MDAC 518. The control circuit 515 is coupled between the sub-ADC 512 and the MDAC 518. The operation principles of the sub-ADC 512 are the same as those of the sub-ADC 112 in FIG. 2, and the details are thus omitted for brevity. The operation principles of the MDAC 518 are similar to those of the MDAC 118, except that the MDAC 518 directly receives the reference voltage $V_R$ (the reference voltage $V_R$ being the reference voltage $V_{REF+}$, the reference voltage $V_{REF-}$ and/or the voltage $V_{CM\_REF}$), instead of selecting the reference voltage $V_{REF+}$, the reference voltage $V_{REF-}$, and/or the voltage $V_{CM\_REF}$ according to any signal.

Figure 4:
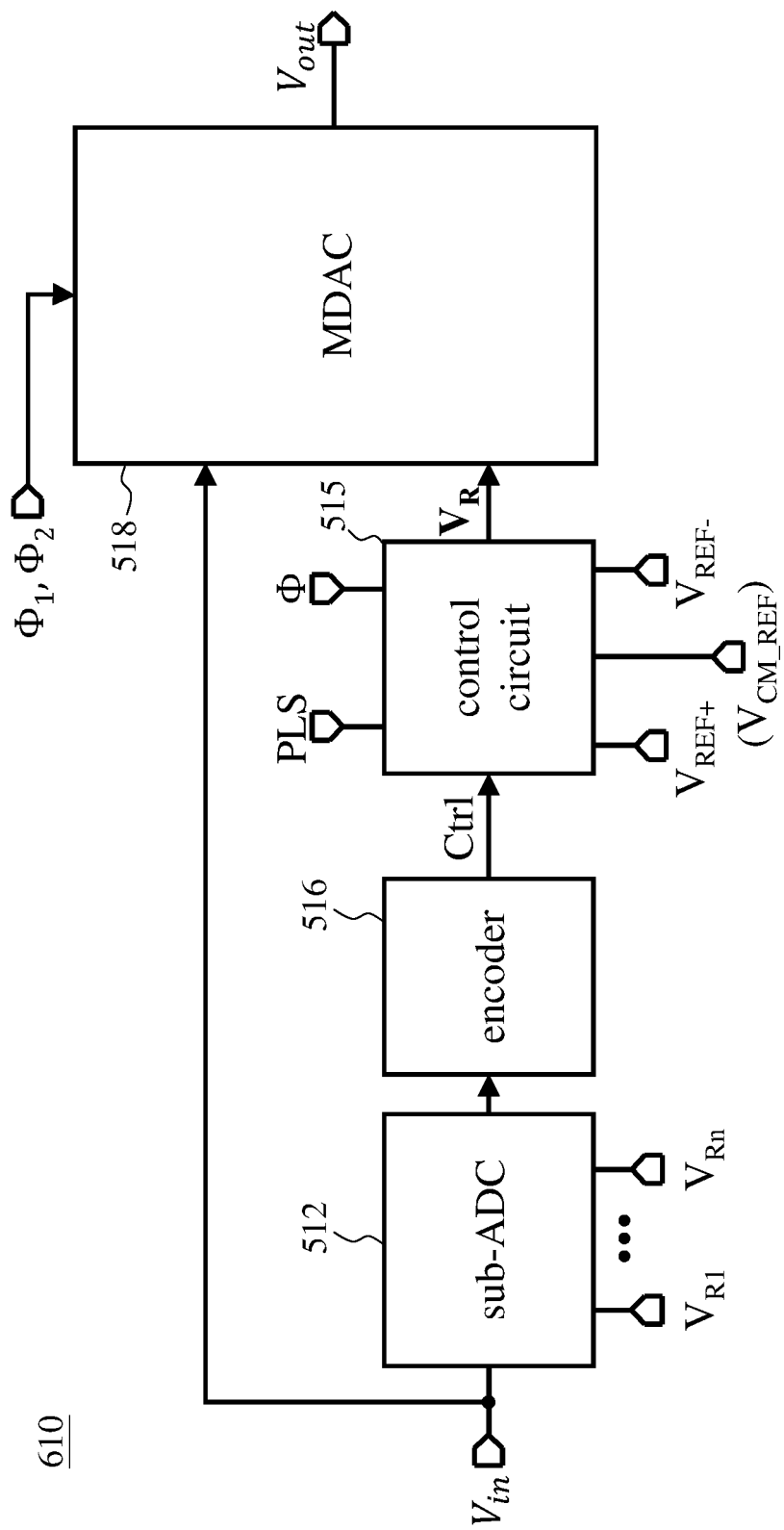
FIG. 4 illustrates a functional block diagram of any operational stage in the pipeline ADC according to another embodiment of this disclosure.

FIG. 4 shows another embodiment of any operational stage in the pipeline ADC of this disclosure. The operational stage 610 includes the sub-ADC 512, the control circuit 515, an encoder 516, and the MDAC 518. The control circuit 515 is coupled between the encoder 516 and the MDAC 518. The operation principles of the encoder 516 are the same as those of the encoder 116 in FIG. 2, and the details are thus omitted for brevity.

Figure 5:
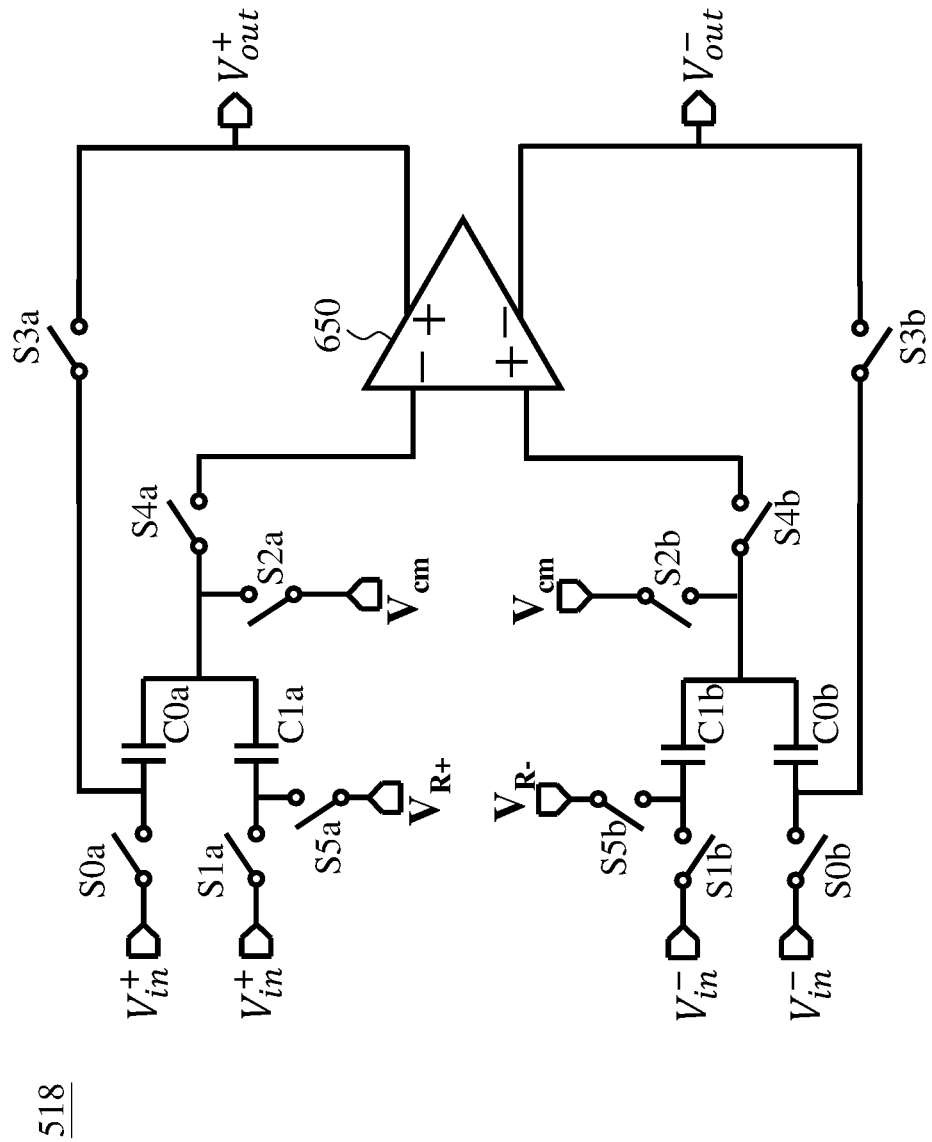
FIG. 5 illustrates an embodiment of the MDAC 518 in FIG. 3 or FIG. 4.
Figure 6:
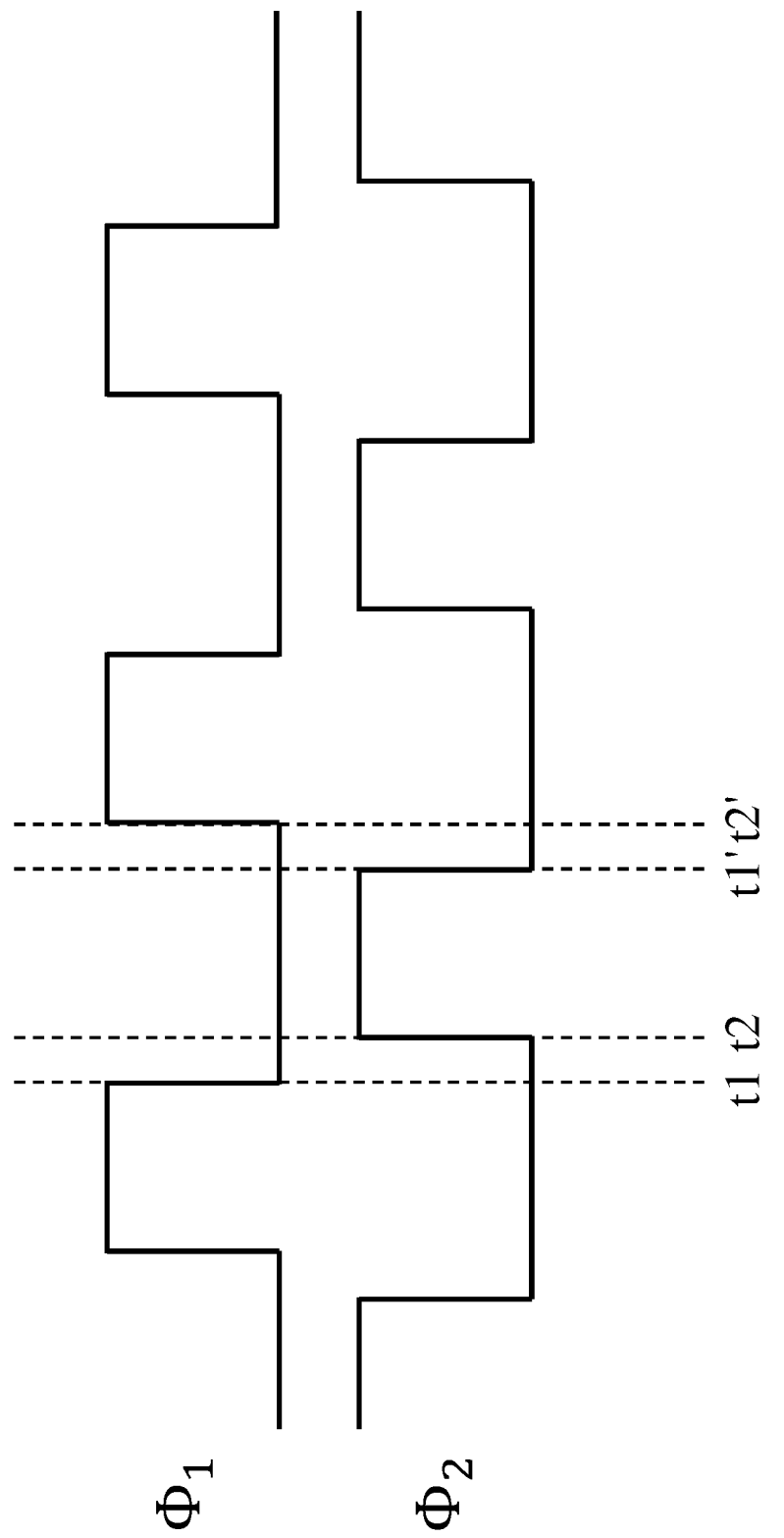
FIG. 6 illustrates two non-overlapping clocks $\Phi_1$ and $\Phi_2$.

FIG. 5 shows an embodiment of the MDAC 518 of FIG. 3 or FIG. 4, which can be used in a 1.5-bit pipeline ADC. The MDAC 518 operates in the sampling phase or the amplification phase according to two non-overlapping clocks $\Phi_1$ and $\Phi_2$ which are shown in FIG. 6 as an example. It is assumed that the circuit operates at the first level (which can be a high level or a low level) of the clock, and that "non-overlapping" means the two clocks not at the same first level at the same time. The interval between the time point t1 and time point t2, and the interval between the time point t1' and time point t2' in FIG. 6 are non-overlapping intervals of the two clocks. "The circuit operating at the first level of the clock" means that when the clock is at the first level, the circuit is active, say, operating in a certain phase (such as the sampling phase or the amplification phase discussed below).

Reference is made to FIG. 5. The MDAC 518 mainly includes an operational amplifier 650 that amplifies signals. The inverting input terminal (negative terminal) of the operational amplifier 650 is coupled to the capacitor C0a and the capacitor C1a through the switch S4a, and the non-inverting input terminal (positive terminal) of the operational amplifier 650 is coupled to the capacitor C0b and the capacitor C1b through the switch S4b. The MDAC 518 alternately operates in the sampling phase and the amplification phase according to the clocks $\Phi_1$ and $\Phi_2$. The following discussions are made by taking the inverting input terminal of the operational amplifier 650 as an example. In the sampling phase (the clock $\Phi_1$ being at the first level (e.g., high level) and the clock $\Phi_2$ being at the second level (e.g., low level)) in which the switches S0a, S1a, and S2a are turned on, and the switches S3a, S4a, S5a are turned off, the capacitors C0a and C1a sample the signal $V_{in}^+$. In the amplification phase (the clock $\Phi_2$ being at the first level and the clock $\Phi_1$ being at the second level) in which the switches S0a, S1a, and S2a are turned off, and the switches S3a, S4a, and S5a are turned on, the capacitor C0a becomes a feedback capacitor, and the MDAC 518 performs subtraction and multiplication operations on the input signal $V_{in}$ and outputs a differential output signal $V_{out}$ (including signal $V_{out}^+$, and signal $V_{out}^-$) which is the input of the next operational stage. People having ordinary skill in the art can understand the operation principles of the non-inverting input terminal of the operational amplifier 650 based on the above discussions, so the details are omitted for brevity. The voltage $V_{cm}$ in FIG. 5 is usually the common-mode voltage of the input terminals of the operational amplifier 650, and the voltages $V_{R+}$ and $V_{R-}$ (collectively referred to as the reference voltage $V_R$ in FIG. 3 or FIG. 4) can be selected from the reference voltage $V_{REF+}$, the reference voltage $V_{REF-}$, or the voltage $V_{CM\_REF}$ in FIG. 3 or FIG. 4.

People having ordinary skill in the art can understand the operation principles of the MDAC used in the pipeline ADC of more bits (2.5 bits or more) based on the above discussions, and the details are thus omitted for brevity.

In the embodiments of FIGS. 3 and 4, the control circuit 515 operates according to the clock $\Phi$ and the pulse PLS, and the clock $\Phi$ can be the clock $\Phi_1$ or the clock $\Phi_2$ in FIG. 6. The control circuit 515 selects the reference voltage $V_{REF+}$, the reference voltage $V_{REF-}$, and/or the voltage $V_{CM\_REF}$ as the reference voltage $V_R$ according to the control value (or control signal) Ctrl; that is, the voltage $V_{R+}$ in FIG. 5 is one of the reference voltage $V_{REF+}$, the reference voltage $V_{REF-}$, and the voltage $V_{CM\_REF}$, and the voltage $V_{R-}$ in FIG. 5 is one of the reference voltage $V_{REF+}$, the reference voltage $V_{REF-}$, and the voltage $V_{CM\_REF}$. In other words, the control circuit 515 outputs the reference voltage $V_{REF+}$, the reference voltage $V_{REF-}$, and/or the voltage $V_{CM\_REF}$ to the MDAC 518 according to the control value Ctrl. In some embodiments, the MDAC 518 does not require the voltage $V_{CM\_REF}$; that is, the reference voltage $V_R$ may include the reference voltage $V_{REF+}$ and/or the reference voltage $V_{REF-}$, but not the voltage $V_{CM\_REF}$.

In the embodiment of FIG. 3, the control value Ctrl is the output value of the sub-ADC 512 (i.e., the result of the comparator (or quantizer)). In the embodiment of FIG. 4, the control value Ctrl is the output of the encoder 516 (i.e., the digital signal b).

Figure 7:
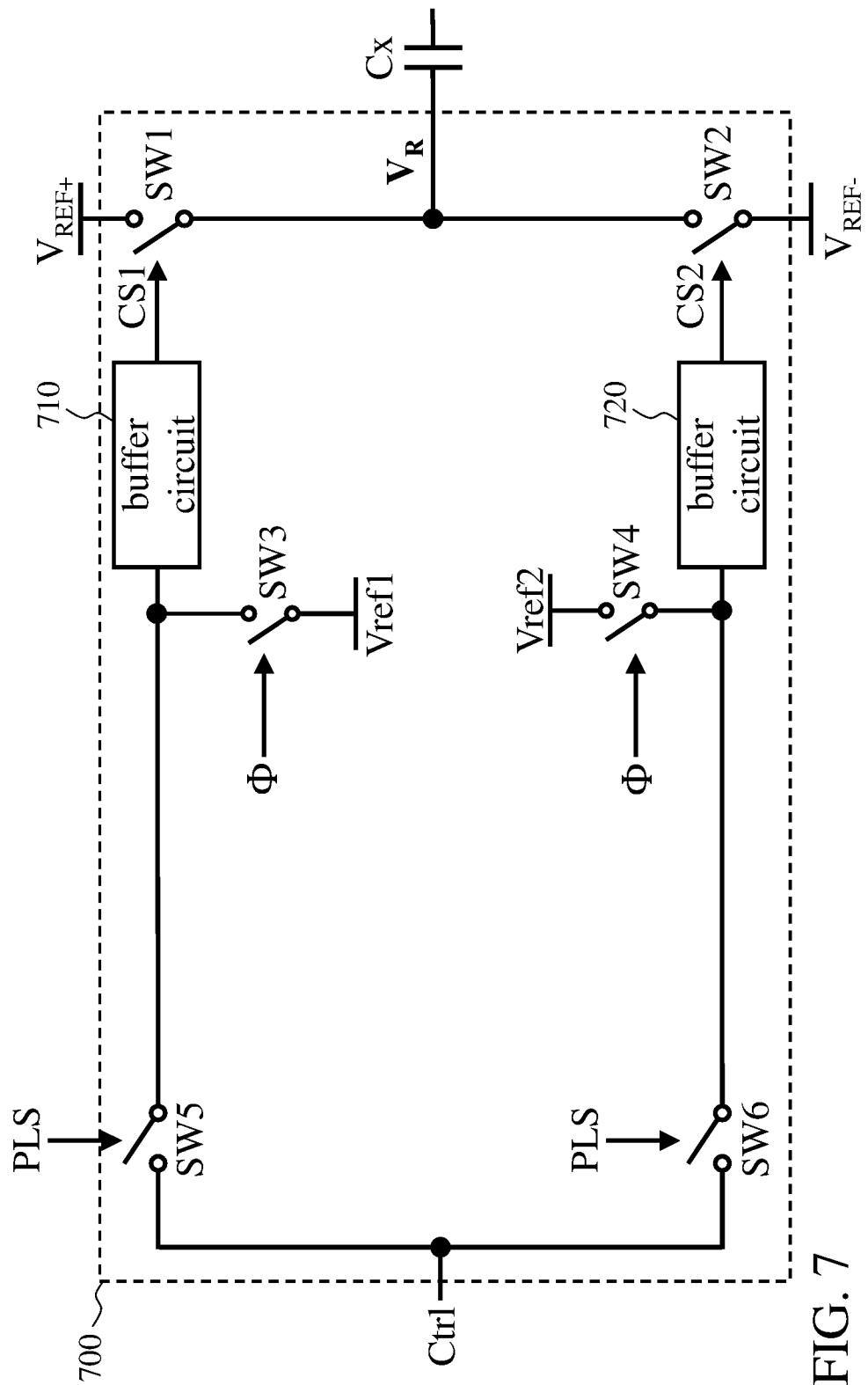
FIG. 7 illustrates a circuit diagram of the control circuit of the pipeline ADC according to an embodiment of this disclosure.

FIG. 7 is a circuit diagram of the control circuit of the pipeline ADC according to an embodiment of this disclosure. The control circuit 515 in FIGS. 3 and 4 can be embodied by the control circuit 700 in FIG. 7. The control circuit 700 is coupled to the capacitor Cx (i.e., the capacitor C1a or the capacitor C1b in FIG. 5) and includes a switch SW1, a switch SW2, a switch SW3, a switch SW4, a switch SW5, a switch SW6, a buffer circuit 710, and a buffer circuit 720. The output terminal of the buffer circuit 710 is coupled to the switch SW1, and the output terminal of the buffer circuit 720 is coupled to the switch SW2.

One end of the capacitor Cx (i.e., the end that is not coupled to the operational amplifier 650) is coupled to the reference voltage $V_{REF+}$ through the switch SW1 and coupled to the reference voltage $V_{REF-}$ through the switch SW2. The switch SW1 and the switch SW2 are respectively controlled by the first switch control signal CS1 and the second switch control signal CS2, which are the output of the buffer circuit 710 and the output of the buffer circuit 720, respectively. The buffer circuit 710 and the buffer circuit 720 are used to enhance the driving capability of the first switch control signal CS1 and the second switch control signal CS2, respectively. In some embodiments, the buffer circuit 710 and the buffer circuit 720 each include at least one inverter.

The input terminal of the buffer circuit 710 is coupled to the first reference voltage through the switch SW3 and coupled to the sub-ADC 512 or the encoder 516 through the switch SW5 (i.e., to receive the control value Ctrl through the switch SW5). The input terminal of the buffer circuit 720 is coupled to the second reference voltage through the switch SW4 and coupled to the sub-ADC 512 or the encoder 516 through the switch SW6 (i.e., to receive the control value Ctrl through the switch SW6). The first reference voltage and the second reference voltage can be the same or different. The switch SW3 and the switch SW4 are turned on or off according to the clock Φ. When the clock Φ is at the first level (e.g., the high level), the MDAC 518 operates in the sampling phase. More specifically, when the clock Φ is at the first level (i.e., when the MDAC 518 is operating in the sampling phase), the switch SW3 and the switch SW4 are turned on, so that the voltage at the input terminal of the buffer circuit 710 is the first reference voltage, and the voltage at the input terminal of the buffer circuit 720 is the second reference voltage. Because the buffer circuit 710 and the buffer circuit 720 are used to enhance the driving capability of first switch control signal CS1 and the second switch control signal CS2, when the voltages at the input terminals of the buffer circuit 710 and the buffer circuit 720 are substantially constant (i.e., when the switch SW3 and the switch SW4 are turned on), the first switch control signal CS1 and the second switch control signal CS2 are maintained at a substantially fixed level. In some embodiments, when the switch SW3 is turned on, the switch SW1 is turned off, and when the switch SW4 is turned on, the switch SW2 is turned off.

The switch SW5 and the switch SW6, which are controlled by the pulse PLS, are turned on or off at the same time. In some embodiments, when the pulse PLS is at the first level (e.g., the high level), the switch SW5 and the switch SW6 are turned on, so that the input terminal of the buffer circuit 710 and the input terminal of the buffer circuit 720 receive the control value Ctrl. When the buffer circuit 710 and the buffer circuit 720 receive the control value Ctrl and the switch SW3 and the switch SW4 are both turned off, the levels of first switch control signal CS1 and the second switch control signal CS2 are determined by the control value Ctrl. In some embodiments, when the switch SW3 and the switch SW4 are turned off and the switch SW5 and the switch SW6 are turned on, the switch SW1 and the switch SW2 are not turned on at the same time (i.e., the capacitor Cx is not coupled to the reference voltage $V_{REF+}$ and the reference voltage $V_{REF-}$ at the same time).

FIG. 8 shows the clock Φ and three embodiments of the pulse PLS (i.e., PLS_1, PLS_2, and PLS_3). When the clock Φ is at the first level (e.g., the high level), the switch SW3 and the switch SW4 are turned on, and the switch SW1 and the switch SW2 are turned off. When the clock Φ is at the second level (e.g., the low level), the switch SW3 and the switch SW4 are turned off. For the pulses PLS_1, PLS_2, and PLS_3, when the pulse PLS is at the first level (e.g., the high level), the switch SW5 and the switch SW6 are turned on; when the pulse PLS is at the second level (e.g., the low level), the switch SW5 and the switch SW6 are turned off.

As shown in FIG. 8, the switch SW5 and the switch SW6 are turned on for a period of time of Δt1, Δt2 or Δt3 in each cycle of the clock Φ.

The falling edges of the pulses PLS_1, PLS_2, and PLS_3 are within the second level of the clock Φ. The pulses PLS_1, PLS_2, and PLS_3 transition from the first level to the second level before the comparator (or quantizer) of the sub-ADC 512 is reset (i.e., before the control value Ctrl becomes a default value); that is, the switch SW5 and the switch SW6 are turned off before the control value Ctrl becomes the default value. In some embodiments, the falling edges of the pulses PLS_1, PLS_2, and PLS_3 are not later than the midpoint of the second level of the clock Φ (i.e., not later than the time point T1 in FIG. 8).

The rising edge of the pulse PLS_1 is substantially aligned with the falling edge of the clock Φ. The rising edge of the pulse PLS_2 is slightly ahead of the falling edge of the clock Φ (i.e., the switches SW3, SW4, SW5 and SW6 are turned on at the same time for a period of time). The rising edge of the pulse PLS_3 is slightly behind the falling edge of the clock Φ (i.e., the switches SW5 and SW6 are turned on after the switches SW3 and SW4 are turned off).

In some embodiments, the comparator (or quantizer) of the sub-ADC 512 is activated and reset according to a reference clock (not shown), and the pulse PLS can be generated based on the reference clock or the clock Φ. For example, the rising edge and/or falling edge of the pulse PLS can be generated by delaying the reference clock or the clock Φ by multiple gate delays. Alternatively, the falling edge of the pulse PLS can be obtained by delaying the rising edge of the pulse PLS by multiple gate delays. People having ordinary skill in the art are familiar with the use of gate delay techniques to embody the above-mentioned design principles of the pulse PLS, and the details are thus omitted for brevity.

Figure 9A:
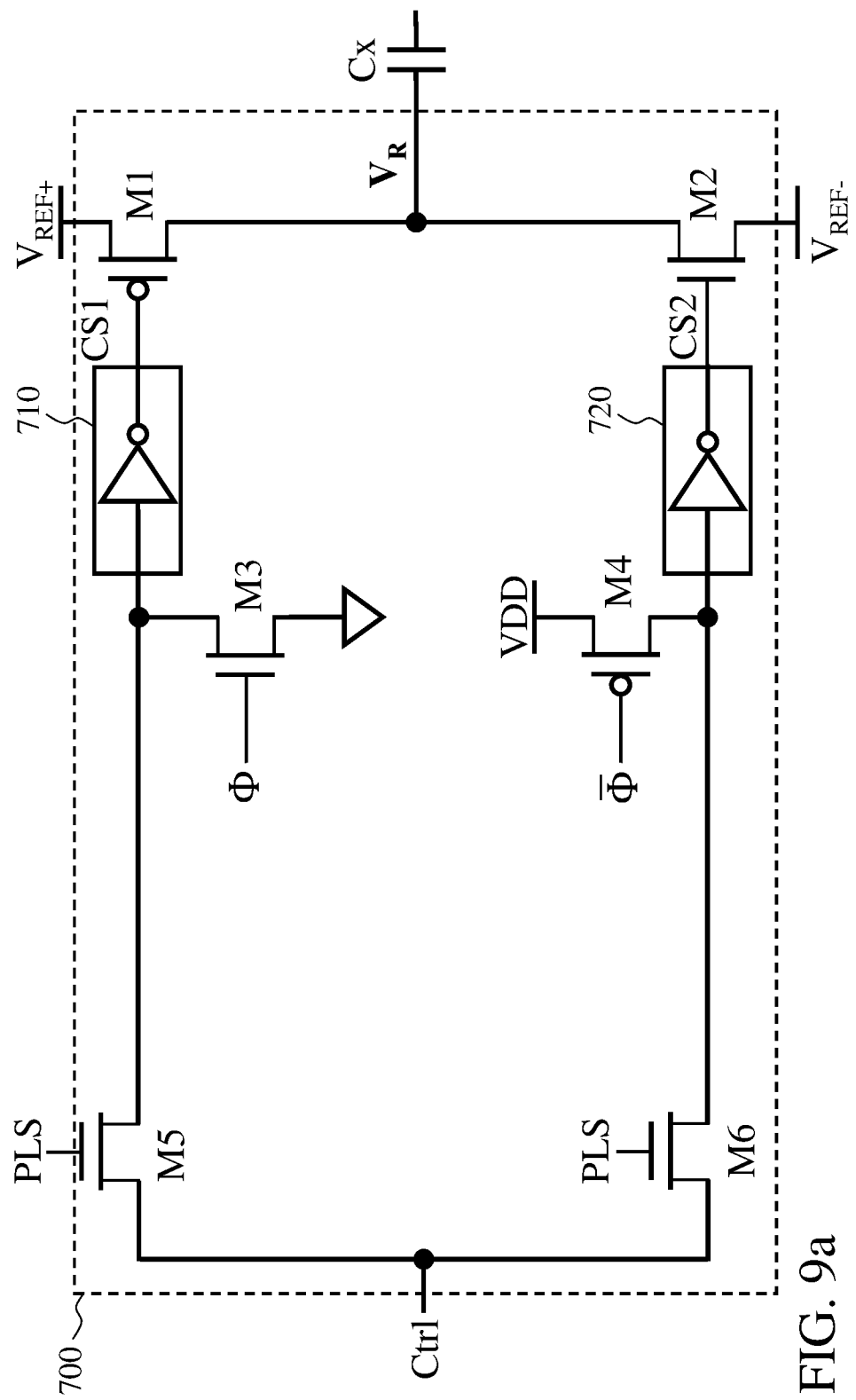
FIGS. 9a and 9b illustrate two embodiments of the control circuit of FIG. 7.

In some embodiments (as shown in FIG. 9a), the switch SW1 is embodied by a P-channel Metal-Oxide-Semiconductor Field-Effect Transistor (hereinafter referred to as PMOS transistor) (M1), the switch SW2 is embodied by an N-channel Metal-Oxide-Semiconductor Field-Effect Transistor (hereinafter referred to as NMOS transistor) (M2), the switch SW3 is embodied by an NMOS transistor (M3), the switch SW4 is embodied by a PMOS transistor (M4), the switch SW5 is embodied by an NMOS transistor (M5), the switch SW6 is embodied by an NMOS transistor (M6), the first reference voltage is the ground level, the second reference voltage is the power supply voltage VDD (which is greater than the ground level), the buffer circuit 710 includes an odd number of inverter(s), and the buffer circuit 720 includes an odd number of inverter(s).

Figure 9B:
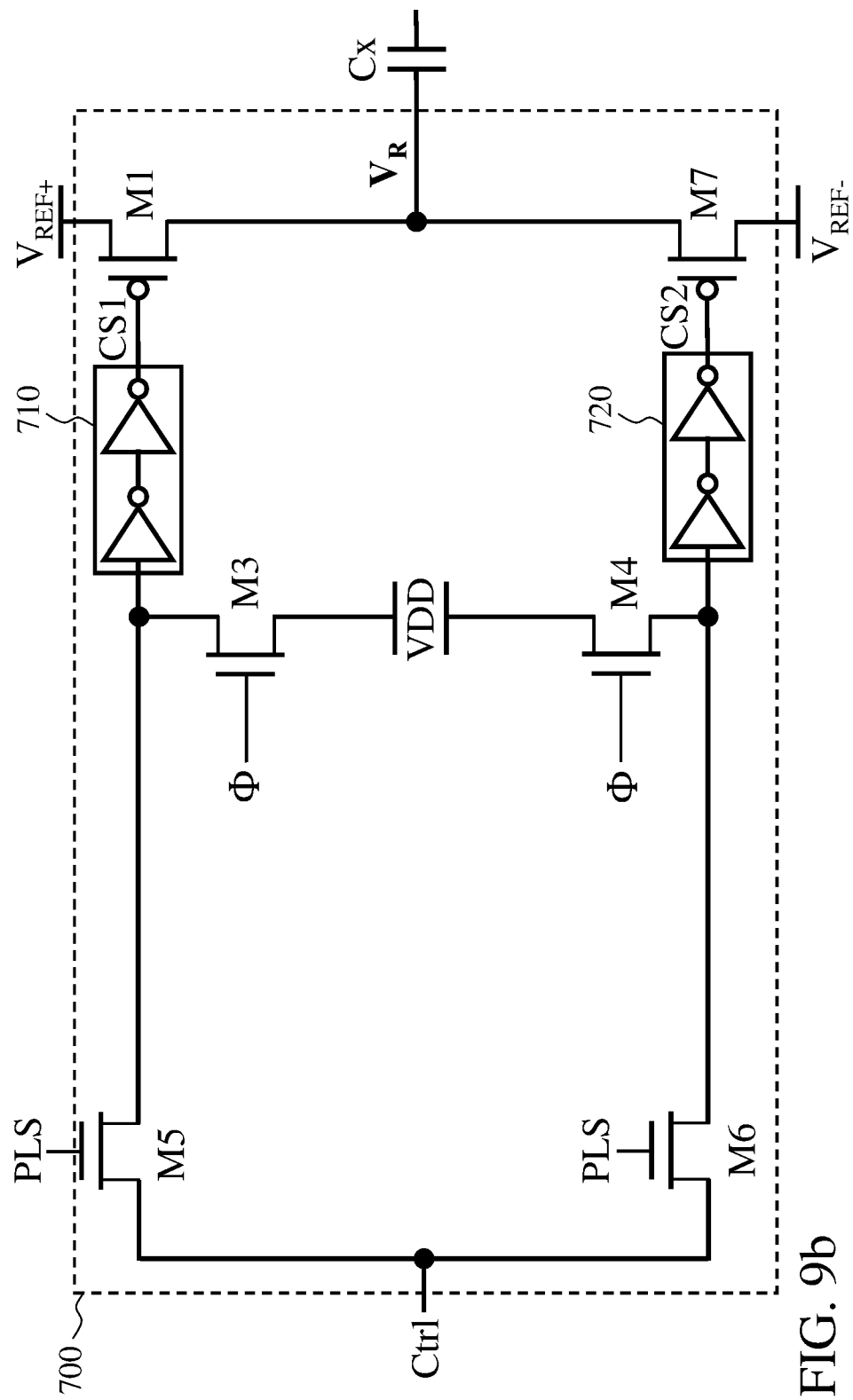

In another embodiment (as shown in FIG. 9b), the switch SW1 (M1) and the switch SW2 (M7) are of the same type (e.g., the transistors M1 and M7 are both PMOS transistors), both the buffer circuit 710 and the buffer circuit 720 include an even number of inverters, and the first reference voltage and the second reference voltage are both the power supply voltage VDD.

It should be noted that the embodiments discussed above are intended to illustrate this disclosure by way of examples, rather than to limit the scope of this disclosure. People having ordinary skill in the art can adjust or modify the components, signals and/or parameters of FIG. 7 based on the discussions made above. The components, signals and/or parameters include but not exclusively: the types of the switches SW1 to SW6 (PMOS transistor, NMOS transistor or their equivalents), the levels of multiple voltages (the first reference voltage, the second reference voltage, the reference voltage $V_{REF+}$, and the reference voltage $V_{REF-}$), the levels and/or duty cycles of the clock $\Phi$ and the pulse PLS, and the number of inverters that the buffer circuits 710 and 720 include.

In the embodiment of FIG. 7, after the switch SW5 (or SW6) is turned off, the voltage at the input terminal of the buffer circuit 710 (or 720) can be naturally maintained for a period of time (depending on the magnitude of the leakage current of the switch SW3 (or SW4)).

Figure 10:
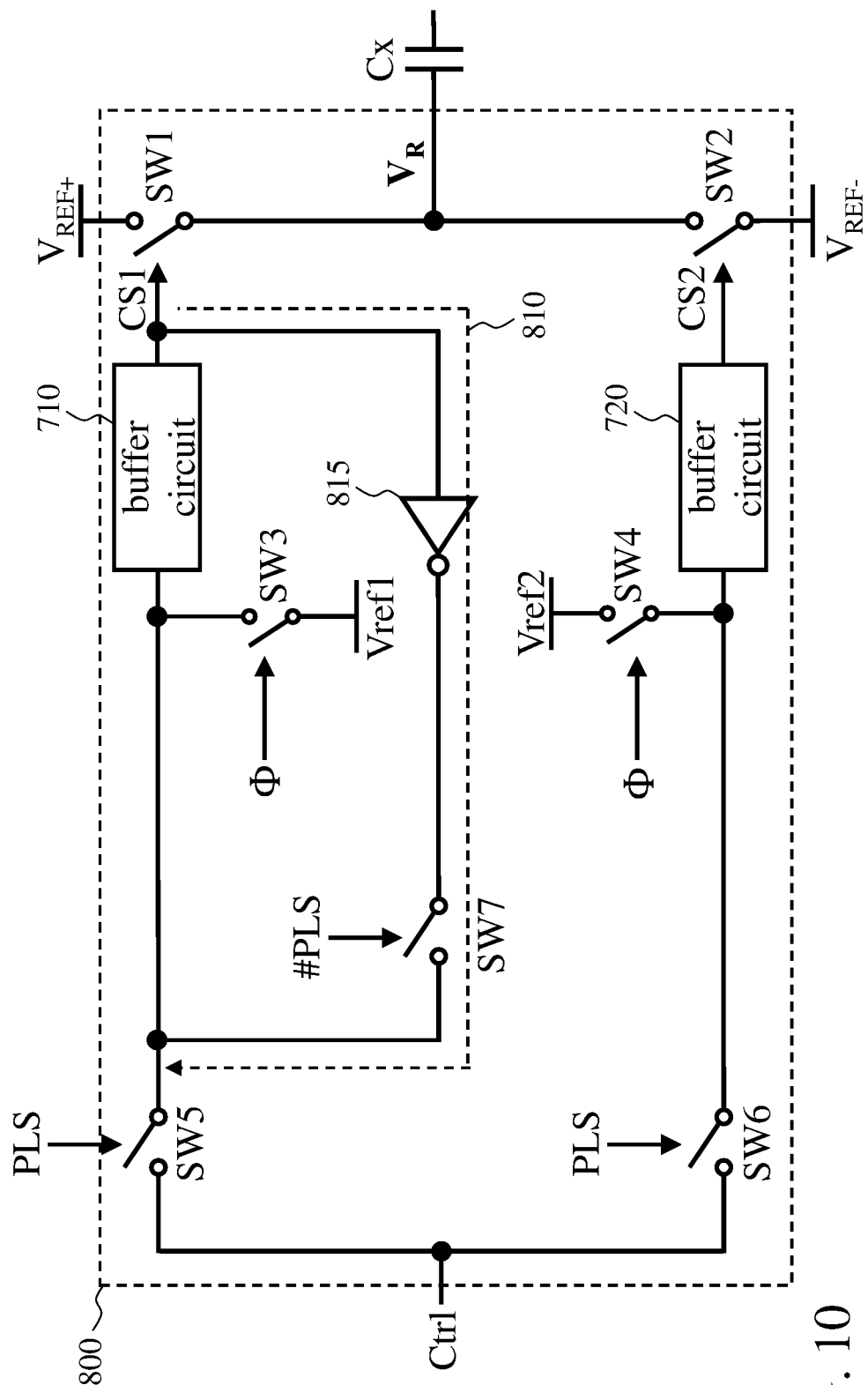
FIG. 10 illustrates a circuit diagram of the control circuit of the pipeline ADC according to another embodiment of this disclosure.

FIG. 10 is a circuit diagram of the control circuit of the pipeline ADC according to another embodiment of this disclosure. The control circuit 800 is similar to the control circuit 700 except that the control circuit 800 further includes a feedback path 810. The feedback path 810 is coupled between the output terminal of the buffer circuit 710 and the input terminal of the buffer circuit 710. The feedback path 810 includes an inverter 815 and a switch SW7. The input terminal of the inverter 815 is coupled to the output terminal of the buffer circuit 710, and the output terminal of the inverter 815 is coupled to the input terminal of the buffer circuit 710 through the switch SW7. The switch SW7 is controlled by the inverted signal #PLS of the pulse PLS. More specifically, when the pulse PLS is at the first level (i.e., the switch SW5 and the switch SW6 are turned on), the switch SW7 is turned off (i.e., the feedback path 810 is open), and when the pulse PLS is at the second level (i.e., the switch SW5 and the switch SW6 are turned off), the switch SW7 is turned on. In this way, the inverter 815 on the feedback path 810 can help keep the voltage at the input terminal of the buffer circuit 710 after the switch SW5 is turned off.

It should be noted that in the embodiment of FIG. 10, the voltage at the input terminal of the buffer circuit 710 is opposite to the voltage at the output terminal of the buffer circuit 710. More specifically, when the buffer circuit 710 includes an odd number of inverter(s), the feedback path 810 includes an odd number of inverter(s). In other embodiments, however, when the buffer circuit 710 includes an even number of inverters, the feedback path 810 includes an even number of inverters.

In other embodiments, another feedback circuit couple between the output terminal of the buffer circuit 720 and the input terminal of the buffer circuit 720 may also be provided.

Figure 11:
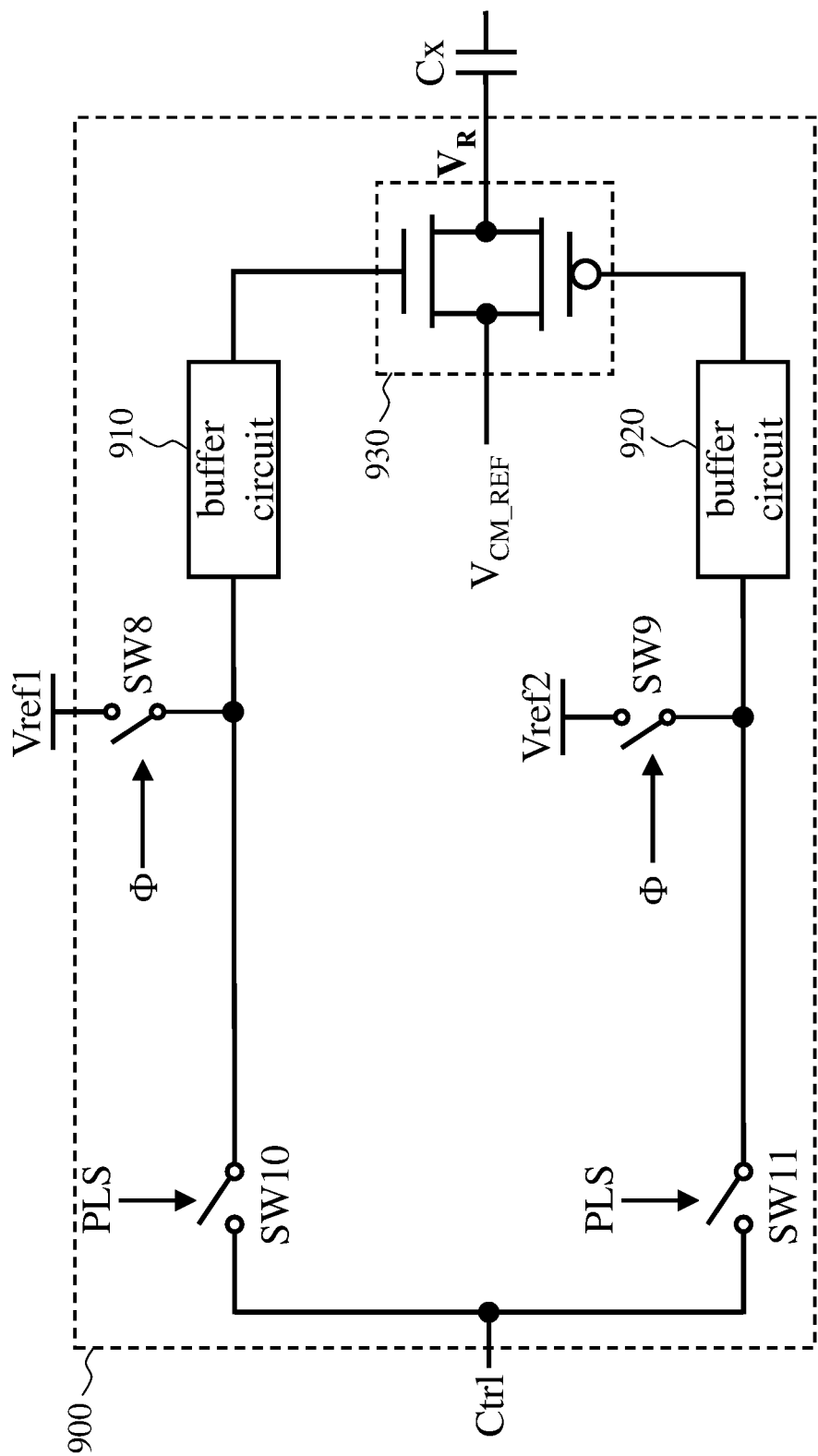
FIG. 11 illustrates a circuit diagram of the control circuit of the pipeline ADC according to another embodiment of this disclosure.

FIG. 11 is a circuit diagram of the control circuit of the pipeline ADC according to another embodiment of this disclosure. In some embodiments, the control circuit 515 in FIGS. 3 and 4 is embodied by a combination of the control circuit 900 and the control circuit 700, or a combination of the control circuit 900 and the control circuit 800. The control circuit 900 is used to provide the voltage $V_{CM\_REF}$ to the capacitor Cx. The control circuit 900 includes a buffer circuit 910, a buffer circuit 920, a transmission gate 930, a switch SW8, a switch SW9, a switch SW10, and a switch SW11.

When the clock $\Phi$ is at the first level, the switch SW8 and the switch SW9 are turned on, rendering the voltage at the input terminal of the buffer circuit 910 and the voltage at the input terminal of the buffer circuit 920 the first reference voltage and the second reference voltage (which is the same as or different from the first reference voltage), respectively, which in turn switches off the transmission gate 930 (i.e., the capacitor Cx does not receive the voltage $V_{CM\_REF}$). When the clock $\Phi$ is at the second level and the pulse PLS is at the first level, the switch SW8 and the switch SW9 are turned off, and the switch SW10 and the switch SW11 are turned on, causing the buffer circuit 910 and the buffer circuit 920 to receive the control value Ctrl at their input terminals.

When the clock $\Phi$ is at the second level and the pulse PLS is at the second level, the switch SW8, the switch SW9, the switch SW10, and the switch SW11 are all turned off, and, in this instance, the reference voltage $V_R$ is the same as or different from the voltage $V_{CM\_REF}$.

In some embodiments, the buffer circuit 910 and the buffer circuit 920 are embodied by inverter(s). The buffer circuit 910 includes an even number of inverters, while the buffer circuit 920 includes an odd number of inverter(s). As a result, when the control value Ctrl is 0 (i.e., the low level), the voltage at the output terminal of the buffer circuit 910 and the output terminal of the buffer circuit 920 are at the low level and the high level, respectively, causing the transmission gate 930 to be switched on (i.e., the reference voltage $V_R$ is the same as the voltage $V_{CM\_REF}$). When the control value Ctrl is 1 (i.e., the high level), the voltage at the output terminal of the buffer circuit 910 and the voltage at the output terminal of the buffer circuit 920 are at the high level and the low level, respectively, causing the transmission gate 930 to be switched off.

In summary, because the control circuit in this disclosure reduces the gate delay in the signal path, the control value Ctrl (i.e., the output of the sub-ADC 512 or the output of the encoder 516) can be promptly provided to the MDAC 518, which improves the operation speed of the pipeline ADC and reduces the power consumption area of the operational amplifier.

The shape, size, and ratio of any element in the disclosed figures are exemplary for understanding, not for limiting the scope of this disclosure.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. A control circuit of a pipeline analog-to-digital converter (ADC), the pipeline ADC comprising a multiplying digital-to-analog converter (MDAC) which comprises a capacitor, the control circuit comprising:
   a first switch, coupled between a first end of the capacitor and a first reference voltage;
   a second switch, coupled between the first end of the capacitor and a second reference voltage;
   a third switch;
   a fourth switch;
   a fifth switch;
   a sixth switch;
   a first buffer circuit having a first input terminal and a first output terminal, wherein the first output terminal is coupled to the first switch, and the first input terminal is coupled to a third reference voltage through the third switch or receives a control signal through the fifth switch; and
   a second buffer circuit having a second input terminal and a second output terminal, wherein the second output terminal is coupled to the second switch, and the second input terminal is coupled to a fourth reference voltage through the fourth switch or receives the control signal through the sixth switch;
   wherein the first reference voltage is different from the second reference voltage, and the first switch and the second switch are not turned on simultaneously.

2. The control circuit of claim 1, wherein the MDAC performs a sampling operation at a first level of a clock, the third switch and the fourth switch are turned on at the first level of the clock, and the first switch and the second switch are turned off at the first level of the clock.

3. The control circuit of claim 1, wherein the MDAC performs a sampling operation at a first level of a clock, and the fifth switch and the sixth switch are turned on before the clock transitions from the first level to a second level.

4. The control circuit of claim 3, wherein the fifth switch and the sixth switch are turned off prior to a level transition of the control signal.

5. The control circuit of claim 1, wherein the MDAC performs a sampling operation at a first level of a clock, and the fifth switch and the sixth switch are turned on after the clock transitions from the first level to a second level.

6. The control circuit of claim 5, wherein the fifth switch and the sixth switch are turned off prior to a level transition of the control signal.

7. The control circuit of claim 1, further comprising:
a feedback path, comprising an inverter;
wherein the inverter has an input terminal and an output terminal, the input terminal is coupled to the first output terminal of the first buffer circuit, and the output terminal is coupled to the first input terminal of the first buffer circuit.

8. The control circuit of claim 7, wherein when the fifth switch or the sixth switch is turned on, the feedback path is open.

9. The control circuit of claim 1, wherein the first switch is a P-channel Metal-Oxide-Semiconductor Field-Effect Transistor (MOSFET), the second switch is an N-channel MOSFET, the first buffer circuit comprises at least one inverter, the second buffer circuit comprises at least one inverter, and the fourth reference voltage is greater than the third reference voltage.

10. The control circuit of claim 1, wherein the first switch and the second switch are Metal-Oxide-Semiconductor Field-Effect Transistors (MOSFETs) of a same type, the first buffer circuit comprises at least one inverter, the second buffer circuit comprises at least one inverter, and the fourth reference voltage is identical to the third reference voltage.

11. The control circuit of claim 1, further comprising:
a transmission gate, coupled to the first end of the capacitor and receiving a fifth reference voltage;
a seventh switch;
an eighth switch;
a ninth switch;
a tenth switch;
a third buffer circuit having a third input terminal and a third output terminal, wherein the third output terminal is coupled to the transmission gate, and the third input terminal is coupled to the third reference voltage through the seventh switch or receives the control signal through the ninth switch; and
a fourth buffer circuit having a fourth input terminal and a fourth output terminal, wherein the fourth output terminal is coupled to the transmission gate, and the fourth input terminal is coupled to the fourth reference voltage through the eighth switch or receives the control signal through the tenth switch.

12. The control circuit of claim 11, further comprising:
a feedback path, comprising an inverter;
wherein the inverter has an input terminal and an output terminal, the input terminal is coupled to the first output terminal of the first buffer circuit, and the output terminal is coupled to the first input terminal of the first buffer circuit.

13. The control circuit of claim 12, wherein when the fifth switch or the sixth switch is turned on, the feedback path is open.

14. The control circuit of claim 11, wherein the first switch is a P-channel Metal-Oxide-Semiconductor Field-Effect Transistor (MOSFET), the second switch is an N-channel MOSFET, the first buffer circuit comprises at least one inverter, the second buffer circuit comprises at least one inverter, and the fourth reference voltage is greater than the third reference voltage.

15. The control circuit of claim 11, wherein the first switch and the second switch are Metal-Oxide-Semiconductor Field-Effect Transistors (MOSFETs) of a same type, the first buffer circuit comprises at least one inverter, the second buffer circuit comprises at least one inverter, and the fourth reference voltage is identical to the third reference voltage.

* * * * *